United States Patent [19]

Mart

[11] 4,367,940

[45] Jan. 11, 1983

[54] CHEMICAL APPLICATION AND DEVELOPER APPARATUS FOR LITHOGRAPHIC PLATE PROCESSOR

[76] Inventor: Milam E. Mart, P.O. Box 29, Carrollton, Tex. 75006

[21] Appl. No.: 159,639

[22] Filed: Jun. 16, 1980

[51] Int. Cl.³ .............................................. G03D 5/06
[52] U.S. Cl. .................................... 354/317; 354/324; 354/328; 15/77; 118/109; 118/120; 118/315; 366/239; 222/166
[58] Field of Search .............. 354/317, 318, 324, 327, 354/328, 297, 330; 15/77, 102; 101/130; 118/109, 120, 314, 315; 366/219, 224, 239; 222/164, 166, 486

[56] References Cited

U.S. PATENT DOCUMENTS

| | | | |
|---|---|---|---|
| 361,070 | 4/1887 | Long | 354/327 |
| 471,131 | 3/1892 | Miles | 366/239 |
| 1,171,627 | 2/1916 | Muller . | |
| 1,946,627 | 2/1934 | Karrer . | |
| 2,154,585 | 4/1939 | Samandji . | |
| 2,412,317 | 12/1946 | Campbell . | |
| 2,496,947 | 2/1950 | Luboshez . | |
| 2,555,874 | 6/1951 | Coughlin . | |
| 2,677,320 | 5/1954 | Coughlin . | |
| 2,877,700 | 3/1959 | Keller | 354/327 |
| 3,059,560 | 3/1958 | Gutzmer . | |
| 3,088,391 | 5/1963 | Sigler . | |
| 3,113,034 | 12/1963 | Fix . | |
| 3,271,226 | 9/1966 | Staehle et al. . | |
| 3,277,808 | 10/1966 | Frohock . | |
| 3,322,053 | 5/1967 | Good . | |
| 3,338,149 | 8/1967 | Hemery . | |
| 3,435,749 | 4/1969 | Cauwe et al. . | |
| 3,589,261 | 1/1968 | Krikelis . | |
| 3,593,641 | 11/1968 | Adams et al. . | |
| 3,608,464 | 5/1968 | Harrell et al. . | |
| 3,621,772 | 11/1971 | Bogue . | |
| 3,623,416 | 11/1971 | Anderberg | 354/330 |
| 3,625,131 | 11/1968 | Puls . | |
| 3,682,078 | 8/1972 | Parker et al. . | |
| 3,682,079 | 8/1972 | Casson, Jr. . | |
| 3,691,582 | 9/1972 | Call | 15/77 |
| 3,719,133 | 3/1973 | Haracz . | |
| 3,752,054 | 8/1973 | Scanlan . | |
| 3,771,428 | 11/1973 | Horner et al. . | |
| 3,936,853 | 2/1976 | Mart . | |
| 4,128,326 | 12/1978 | Selak . | |
| 4,222,656 | 9/1980 | Harrell et al. | 118/314 |

FOREIGN PATENT DOCUMENTS

| | | |
|---|---|---|
| 87711 | 8/1959 | Denmark . |
| 949710 | 9/1956 | Fed. Rep. of Germany . |

OTHER PUBLICATIONS

Sandmar, Geiss-America, Inc. (Advertisement).
Lith-Kem-Corp. (Advertisement).
The Milart Co. (Advertisement).

Primary Examiner—L. T. Hix
Assistant Examiner—Alan Mathews
Attorney, Agent, or Firm—Richards, Harris & Medlock

[57] ABSTRACT

A lithographic plate processor (10) includes developer apparatus (12) and chemical distribution apparatus (14, 15). The developer apparatus (12) insures a uniform spreading of the developer over the exposed surface of a lithographic plate traveling through the processor. The developer apparatus (12) includes a pair of spreading members (40, 42) which are pivotally connected to each other by a parallel linkage (44). The parallel linkage (44) in turn is pivotally mounted to a subframe (46). A mechanism is provided for rotating a shaft (94) which drives a linkage to create an oscillating motion in the spreading members (40, 42) to uniformly spread the developer over the surface of the lithographic plate. The chemical distribution apparatus (14, 15) includes a tank (32) in which an agitating bar (38) is provided. The tank is mounted for oscillation and has a plurality of apertures (138) formed in the front wall (130) thereof to distribute chemical from within the tank to a lithographic plate below. The agitating bar (38) acts to agitate the chemical and a portion of the bar may be raised off the interior surface of the tank to enhance the agitation. The top portion of the tank may also be sloped towards the front wall (130) so that the agitator bar (38) further acts to increase the pressure driving the chemical through the apertures (138).

18 Claims, 8 Drawing Figures

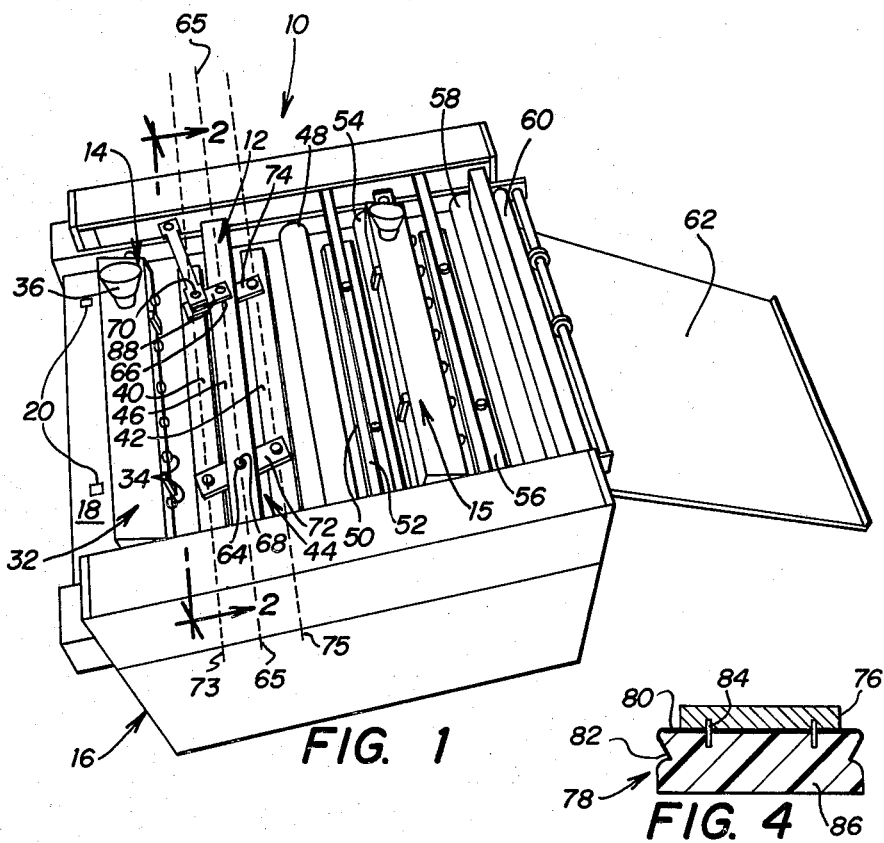
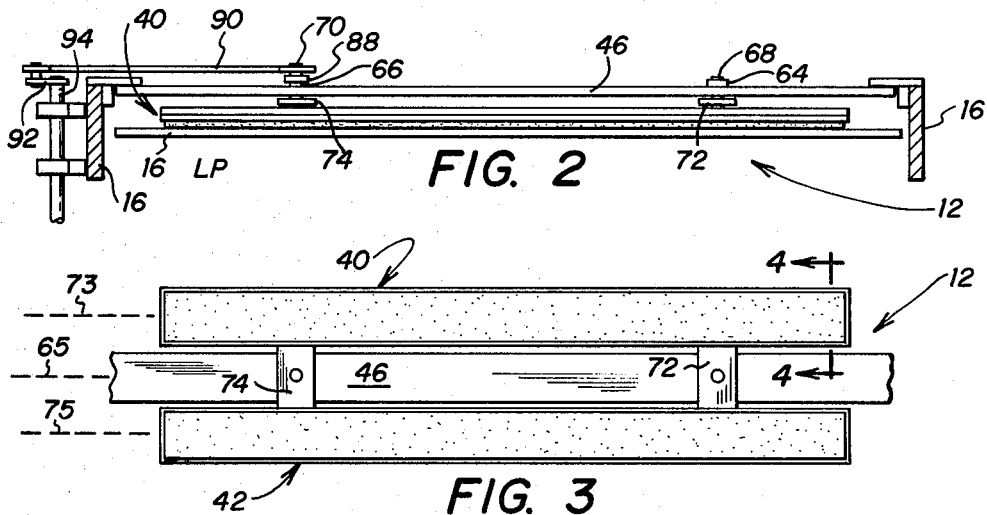

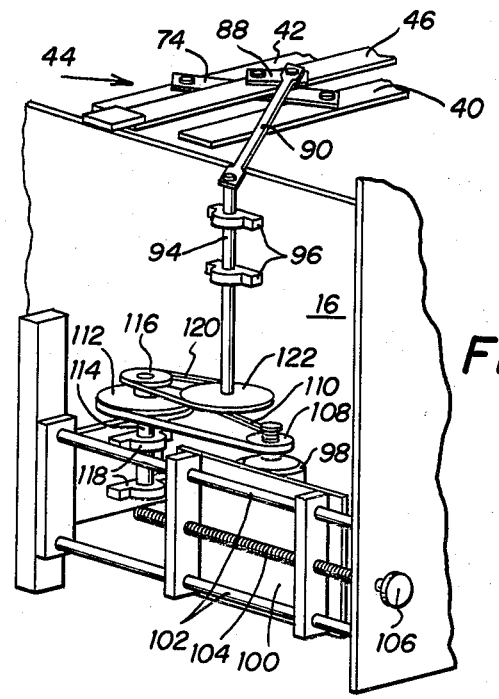

4,367,940

CHEMICAL APPLICATION AND DEVELOPER APPARATUS FOR LITHOGRAPHIC PLATE PROCESSOR

TECHNICAL FIELD

This invention relates to the art of processing exposed lithographic plates, and in particular to chemical application and developer apparatus for use in a lithographic plate processor.

BACKGROUND ART

In the lithographic printing process, a lithographic plate comprising an aluminum sheet is initially coated with a photosensitive layer. A negative is applied over the photosensitive layer, after which the lithographic plate having the negative applied thereto is exposed to high intensity light. The negative is then removed, and the plate is fed into a lithographic plate processor.

In the processor, developer is initially applied to the exposed surface of the plate and is then spread across the entire exposed surface. A developer apparatus distributes the developer on the exposed surface. Next, the exposed surface is washed to remove excess developer. A layer of gum arabic is then applied to the exposed surface, after which the lithographic plate may be dried.

Following the processing operation, the lithographic plate is ready for use in a conventional lithographic press to effect printing. In the press, ink is applied to the plate by means of a roller. The plate is then utilized to print on a blanket, which is in turn used to print a plurality of sheets formed from paper or other material in a conventional manner.

U.S. Pat. No. 3,936,853, issued Feb. 3, 1976 to Milam E. Mart discloses one such developer apparatus. In that patent, spreader members are rotated about axes of rotation along a line extending transversely to the direction of movement of the lithographic plate through the processor. Both developer and gum arabic are applied on the lithographic plate through a conduit having a plurality of discharge outlets.

DISCLOSURE OF THE INVENTION

In accordance with the present invention, an apparatus for use in a lithographic plate processor for agitating a chemical is provided. The apparatus comprises a tank for containing a quantity of the chemical pivotally mounted on the processor, the tank defining a first surface and means to oscillate the tank about its pivotal axis. The apparatus further comprises means for moving along the first surface within the tank as the tank is oscillated to agitate the chemical.

In accordance with another aspect of the present invention, an apparatus for use in a lithographic plate processor for distributing a chemical on a lithographic plate is provided. The apparatus comprises a tank for containing the chemical pivotally mounted on the processor, a first wall of the tank having apertures formed therein and means to oscillate the tank between first and second limits about its pivotal axis, the chemical being discharged from the tank through the apertures onto the lithographic plate when the tank is away from the first limit.

In accordance with yet another aspect of the present invention, a developer apparatus for use in a lithographic plate processor is provided. The developer apparatus comprises a pair of rectangularly shaped developer spreading members positioned on opposite sides of a predetermined line extending generally transverse to the direction of motion of a lithographic plate traveling through the processor, each spreading member further positioned for engagement with the exposed surface of the lithographic plate. The developer apparatus further comprises means for mounting the spreading members on the processor so that the medial axis of each spreading member in its elongate direction is parallel the predetermined line, the mounting means permitting the spreading members to pivot about axes centered on the predetermined line and on a line parallel the predetermined line at a distance at least equivalent to the separation between the medial axes of each spreading member and the predetermined line so that the spreading members may oscillate over the exposed surface of the lithographic plate to uniformly spread developer thereon. The developer apparatus further comprises means to oscillate the spreading members.

BRIEF DESCRIPTION OF THE DRAWINGS

A more complete understanding of the invention may be had by reference to the following Detailed Description when taken in conjunction with the accompanying Drawings, wherein:

FIG. 1 is a perspective view of a lithographic plate processor;

FIG. 2 is a side view of the developer apparatus of the present invention taken along line 2—2 in FIG. 1 in the direction of the arrows;

FIG. 3 is a bottom view of the developer apparatus of the present invention;

FIG. 4 is an end view of a spreading member forming a portion of the developer apparatus taken along line 4—4 in FIG. 3 in the direction of the arrows;

FIG. 5 is a perspective view of a portion of the lithographic plate processor showing the mechanism for oscillating the developer spreading members;

FIG. 6 is a perspective view of the portion of the lithographic plate processor illustrating the mechanism for oscillating the chemical tank;

FIG. 7 is a perspective view of the chemical tank for agitating and distributing a chemical on a lithographic plate; and FIG. 8 is a section view of the chemical tank for agitating and distributing a chemical on the lithographic tank taken along line 8—8 in FIG. 7 in the direction of the arrows.

DETAILED DESCRIPTION

Referring now to the drawings, wherein like reference characters designate like or corresponding parts throughout several views, FIG. 1 illustrates a lithographic plate processor 10 utilizing a developer apparatus 12 and chemical distribution apparatus 14 and 15 incorporating the present invention. The processor 10 includes a frame 16 serving as a support for the various operating instrumentalities of the processor. The frame 16 also serves as a housing which encloses the various drive motors, pumps, and other devices which are utilized to effect operation of the processor. The frame 16 further also encloses control circuitry which functions to regulate the operation of the processor.

Exposed lithographic plates are received in the processor 10 on a support surface 18 of the frame 16 at the left hand end thereof (FIG. 1). Upon entering the processor 10, the plate depresses pivotally mounted rollers 20 to initiate the processing cycle. The depression of rollers 20 moves a linkage 22 upward to close a contact within microswitch 24 as shown in FIG. 6. The contact within microswitch 24 is closed unless both levers 26 and 28 are pushed towards the microswitch against spring loading. The plate then passes between a pair of drive rollers (not shown) which function to propel the lithographic plate along the initial portion of a predetermined path extending through the processor 10.

The plate then passes through a chemical distribution apparatus 14 which applies developer to the plate. The apparatus 14 includes a tank 32 pivotally mounted about an axis generally transverse to the predetermined path of the plate through the processor. One end of the tank 32 has a number of petcocks 34 mounted therealong. The chemical developer is supplied to the tank 32 through a funnel 36. To act more effectively, the developer must be maintained in a homogeneous, mixed state within the tank prior to distribution on a lithographic plate. An agitating bar 38 is provided within tank 32 to agitate and force the developer through the petcocks 34 as tank 32 is pivoted to apply the developer to the exposed surface of the lithographic plate in exactly the quantity required in order to completely cover the exposed surface of the plate without waste.

After passing through the distribution apparatus 14 for distributing developer, the lithographic plate LP passes under developer apparatus 12. Apparatus 12 includes spreading members 40 and 42 pivotally interconnected to each other by a parallel linkage 44 which, in turn, is pivotally mounted to a subframe 46 extending transversely across the processor. As will become more apparent hereafter, the developer apparatus 12 functions to oscillate the spreading members 40 and 42 to spread the developer evenly over the entire exposed surface of the plate to achieve a superior and uniform developing result.

The lithographic plate then moves between a pair of drive rollers 48 which function to propel the plate through the intermediate portion of the predetermined path through the processor 10. The plate then passes through a washing apparatus 50 which directs water onto the exposed surface of the lithographic plate to remove excess developer therefrom. The plate then passes under a first oscillating bar 52 which functions to scrub the plate to assure thorough cleaning thereof. The first oscillating bar 52 may comprise a brush for scrubbing the exposed surface of the lithographic plate, and the washing apparatus 50 may comprise structure for directing water through the brush of the first oscillating bar 52. Other washing and scrubbing apparatus may also be utilized in the processor 10, if desired.

The lithographic plate next engages a mechanism which activates the gum arabic applying cycle of the lithographic plate processor 10. The plate passes between a pair of drive rollers 54 which propel the plate through the final portion of the predetermined path through the processor 10. The plate then passes beneath a gum arabic distribution apparatus 15.

The gum arabic distribution apparatus 15 receives gum arabic through a funnel 36 into a tank 32 pivotally mounted on the processor. An agitating bar 38 is also provided and the gum arabic distribution apparatus 14 functions to homogenize and apply gum arabic to the exposed surface of the lithographic plate through petcocks 34 in exactly the quantity required to cover the entire exposed surface of the plate without waste in a manner identical to the developer distribution apparatus 14 discussed.

Having passed under the gum arabic distribution apparatus 15, the lithographic plate passes beneath a second oscillating bar 56 which functions to spread the gum arabic uniformly over the entire exposed surface of the lithographic plate. The plate then passes through a pair of relatively large diameter rollers 58 which function to remove excess gum arabic.

Having passed through the rollers 58, the lithographic plate may be directed through a dryer 60, in which event the plate is delivered from the processor 10 in a ready to use condition. The dryer 60 is operational, and if it is used in conjunction with the processor 10, it is mounted on the frame 16 thereof. In any event, the lithographic plate is received from the processor 10 on a receiving tray 62 from which it may be removed for use in conventional lithographic printing operations.

The construction and operation of the developer apparatus 12 of the lithographic plate processor 10 will be better understood by reference to FIGS. 2-5. The subframe 46 is rigidly secured at both ends to opposite sides of the frame 16 of processor 10. Bearings 64 and 66 are distributed along the length thereof and centered along a predetermined line 65 transverse to the direction of motion of the lithographic plate. The predetermined line may be the medial line of the subframe which divides the subframe into two equal width portions. Pivot pins 68 and 70 are received in bearings 64 and 66, respectively, so that the pins may pivot about an axis generally perpendicular to the exposed surface of the lithographic plate moving through processor 10. Both pins 68 and 70 extend below the subframe 46 and are rigidly secured to the midpoint of generally rectangularly shaped cross pieces 72 and 74, respectively.

The spreading members 40 and 42 are positioned on opposite sides of the predetermined or medial line 65 of the subframe 46 and are positioned for engagement with the exposed surface of the lithographic plate. The spreading members 40 and 42 are formed of generally rectangularly shaped members having a length slightly less than the width of the lithographic plate passing through the processor 10. Spreading member 40 is pivotally mounted at the ends of cross pieces 72 and 74 generally facing the developer distribution apparatus 14. The spreading member 42 is similarly pivotally mounted at the opposite ends of cross pieces 72 and 74 generally facing the gum arabic distribution apparatus 15. In the preferred embodiment, the mounting points between the cross pieces 72 and 74 and the spreading members 40 and 42 preferably are centered along the medial lines 73 and 75 of the spreading members along their elongate direction which divide the members into equal width portions or on a line parallel the medial line more distant from the predetermined line.

Spreading member 40 comprises a rigid bar 76 with a sponge assembly 78 rigidly secured thereto as best seen in FIG. 4. The sponge assembly 78 in turn comprises a sponge mounting bracket 80 having inwardly directed flanges 82, a number of pins 84 extending downwardly from the mounting bracket 80 and a sponge 86 for engaging the surface of the lithographic plate mounted within bracket 80 and secured thereto by the flanges 82 and pins 84. The spreading member 42 is formed of similar elements.

The pivot pin 70 extends above the subframe 46 as best seen in FIG. 2. The offset 88 is rigidly secured at one end to this portion of pivot pin 70. The opposite end of offset 88 is pivotally connected to one end of a pivot arm 90. The opposite end of pivot arm 90, in turn, is pivotally secured to one end of an offset 92. The opposite end of offset 92 is rigidly secured to a rotating shaft 94 mounted in pillow block bearings 96 secured to the frame 16 of the processor 10.

It is clear that rotation of shaft 94 will operate to oscillate the spreading members 40 and 42 in a curvilinear manner over the exposed surface of the lithographic plate traveling through the processor 10. The various members of the linkage interconnecting shaft 94 and the spreading members may be selected to insure that the oscillation of the spreading members uniformly distributes the developing chemical over the plate. In doing so, it is desirable to have the ends of the spreading members extends slightly beyond the edge of the lithographic plate in the width dimension at the limits of the oscillation.

A mechanism for rotating shaft 94 is shown in FIG. 5. A motor 98 is mounted on a motor mount 100. The motor mount 100 is slidably mounted on parallel rods 102 which are secured to the frame 16 of processor 10. A threaded shaft 104 is rotatably mounted in frame 16 and is received within threaded apertures of the motor mount 100. At one end of the shaft 104 is secured a knob 106. The motor mount and motor may be moved along the rods 102 in either direction desired by rotating knob 106. A variable speed pulley 108, which is sold commercially, is mounted at the end of the motor shaft of motor 98. A belt 110 interconnects the pulley 108 with a pulley 112. The pulley 112 is mounted along a common shaft 114 with a gear 116. The common shaft 114 may be rotatably supported in pillow block bearings 118. A chain 120 interconnects gear 116 with a gear 122 mounted at the end of shaft 94 opposite offset 92. The effective diameter of the variable speed pulley 108 may be varied by turning the knob 106 and moving the motor mount along the rods 102 to adjust the speed of oscillation of the spreading members.

In one particular application for processing lithographic plates having a 30 inch width, the spreading members 40 and 42 were constructed having a length of 29 inches. The width of the rigid bars 76 of the spreading members is two inches and the width of the brackets 80 is three inches. The pivotal connection between the cross pieces 72 and 74 and spreading members 40 and 42 lies along the medial axis of the spreading members, i.e. one inch from either side of rigid bars 76. The distance between the pivotal axis of the mounts between each cross piece and the spreading members is 4⅜ inches with the pivotal axis of the mount between the cross piece and subframe centered therebetween. In this application, the rotational velocity of shaft 94 was variable from 120 to 135 rpm. A pivotal interconnection between the cross pieces 72 and 74 and spreading members 40 and 42 was made ¾ inches from the inner edge of the two inch wide bars 76 facing the subframe 46 and 4½ inches apart. However, it was found that this configuration sometimes resulted in zig-zag lines of developer on the plate. In one application for processing lithographic plates having a 60 inch width, the spreading members 40 and 42 have a length of 57 inches.

The operation of the developer distributing apparatus 14 will be described in detail with reference to FIGS. 6–8. It will be understood that the operation of the gum arabic distributing apparatus 15 is identical to the operation of the developer distributing apparatus with the exception of the difference in the chemical accommodated.

The tank 32 rests on brackets 124 which are secured to a shaft 126 as shown in FIG. 6. The shaft 126 is pivotally mounted at its ends to frame 16 on opposite sides of the processor 10 for pivotal motion about an axis generally transverse to the direction of travel of the lithographic plate through the processor. The tank 32 defines an enclosure having a generally flat bottom portion 128, a front wall 130, a rear wall 132, end walls 134 and a sloped top portion 136. A plurality of apertures 138 are formed through the front wall 130 along a line generally equidistant from the planar interior surface 140 defined by the bottom portion 128. The apertures extend above the lithographic plate for its entire width. It is clear that when a chemical is added to the tank through the funnel 36, if the upper surface of the chemical lies above the lowermost portion of the apertures 138, the chemical will flow out through the apertures and onto the lithographic plate therebelow. The discharge of the chemical through the apertures 138 may be controlled by maintaining the chemical level within the tank so that the chemical flows through the apertures during only a portion of the oscillation of the tank induced by the pivotal motion of the shaft 126. A series of petcocks 34 may be secured at the apertures 138 so that the flow through selected apertures may be reduced or shut off entirely.

The agitating bar 38 may be received within the interior of tank 32 and acts not only to agitate the chemical therein but to aid in forcing the chemical through the apertures 138. The planar interior surface 140 provides minimum resistance to rolling of the agitating bar 38 during the oscillation of the tank. The bar 38 may have a uniform diameter throughout its length and extend for a length only slightly less than the interior length of the tank 32.

It can be readily seen that the cross sectional area of the interior of tank 32 parallel the front and rear walls 130 and 132 decreases in the direction of front wall 130. As the tank is oscillated in a first direction so that the agitating bar 38 rolls toward the front wall 130, the decrease in cross sectional area causes the chemical to dam up in front of the bar 38 and increases the flow rate through the apertures 138. This results because of the increased pressure differential between the chemical and outside environment induced by the relative increase in pressure of the chemical between the bar 38 and front wall 130.

In the preferred embodiment, the agitating bar 38 is provided with bands 142 of uniform thickness secured about the outer surface of the bar at its ends. The bands 142 serve to raise a substantial length of the bar 38 a predetermined distance off the interior surface 140. This permits the chemical to flow between the bar 38 and surface 140 as the tank is oscillated and the bar rolls within the tank. This in turn greatly enhances the agitating effect of the motion of the bar within the tank.

In one particular application of the distribution apparatus, a tank 32 was designed to contain approximately a quart of chemical and has a ¾ inch diameter stainless steel rod forming the agitator bar 38. The bands 142 are 1/32 inch in thickness so that the majority of the bar 38 is raised that distance off the interior surface 140 of the tank. In this application, the vertical height of front wall 130 exposed to the chemical is equivalent to the diameter of the agitator bar. The height of the rear wall exposed to the chemical is 2⅜ inches and the width of the interior surface 140 separating the front and rear walls is 2½ inches.

The mechanism for oscillating the tank 32 is best illustrated in FIG. 6. The mechanism includes a variable speed motor 144 having an output shaft connected to an offset 146. A member 148 is pivotally connected to the offset 146 by a pivot pin 150. A threaded shaft 152 is adjustably threaded at one end to the member 148. The opposite end of the threaded shaft 152 is threaded to a member 154 which is pivotally mounted by a pivot pin 156 to an offset 158 secured at the end of shaft 126. The motor 144 is operated when the contact in microswitch 24 is closed. Another control within the circuit of motor permits the motor speed to be adjusted.

It can be seen that when a lithographic plate depresses the rollers 20, the linkage 22 raises off the lever 26, permitting the lever to move outwardly under its spring loading to close a contact and begin rotation of the motor 144. The rotation oscillates the tank 32 between two limits so that the developer chemical is distributed over the exposed surface of the lithographic plate. The quantity of chemical distributed is controlled by the speed of the motor 144. If the lithographic plate passes through the developing section and releases rollers 20, the contact in microswitch 24 is maintained in a closed position until an arm 160, secured along the threaded shaft 152, pushes the arm 28 toward the microswitch 24 to open the contact. The arm 160 is adjusted so that the motor stops in a position with the tank 32 at one limit of its motion tilted to stop the distribution of the chemical after the motor has stopped.

Although a single embodiment of the invention has been illustrated in the accompanying drawings and described in the foregoing Detailed Description, it will be understood that the invention is not limited to the embodiments disclosed, but is capable of numerous rearrangements, modifications and substitutions of parts and elements without departing from the spirit of the invention.

I claim:

1. A developer apparatus for use in a lithographic plate processor comprising:
   a pair of rectangularly shaped developer spreading members positioned on opposite sides of a predetermined line extending generally transverse to the direction of motion of a lithographic plate traveling through the processor, the length of each spreading member in the transverse direction being slightly less than the width of the lithographic plate in the transverse direction, each spreading member further positioned for engagement with the exposed surface of the lithographic plate;
   a plurality of cross piecs for mounting said spreading members on the processor so that the medial axis of each spreading member in its elongate direction is parallel said predetermined line, said plurality of cross pieces permitting said spreading members to pivot about axes centered on said predetermined line and on a line parallel said predetermined line at a distance at least equivalent to the separation between the medial axis of each spreading member and said predetermined line so that said spreading members may oscillate over the exposed surface of the lithographic plate to uniformly spread developer thereon, said plurality of cross pieces forming parallel linkages; and
   means to oscillate said spreading members in both directions about a central position where the spreading members are most distant from said predetermined line so that a portion of each spreading member extends over the edge of the lithographic plate at the limits of oscillation.

2. The developer apparatus of claim 1 further comprising:
   a subframe extending transversely across the processor and secured thereto and mounting each cross piece equidistant from the mount between the cross piece and spreading members for pivotal motion about an axis on said predetermined line.

3. The developer apparatus of claim 1 wherein each of said spreading members includes a sponge for spreading developer over the exposed surface of a lithographic plate.

4. An apparatus for use in a lithographic plate processor of the type wherein developer is deposited on the exposed surface of a lithographic plate moving through the processor comprising:
   a tank for containing a quantity of the chemical pivotally mounted on the processor, said tank defining a first surface and a second surface extending at an angle therefrom having apertures therethrough for discharge of the chemical from the tank;
   means to oscillate said tank about its pivotal axis;
   means for moving along said first surface within said tank as said tank is oscillated to agitate the chemical, a portion of said moving means being separated from the first surface to permit flow of the chemical therebetween to enhance the agitation;
   a pair of rectangularly shaped developer spreading members positioned on opposite sides of a predetermined line extending generally transverse to the direction of motion of the lithographic plate through the processor, each spreading member further positioned for engagement with the exposed surface of the lithographic plate;
   a plurality of cross pieces extending between said spreading members, said cross pieces being pivotally mounted to each of said spreading members to form a parallel linkage so that the medial line of each spreading member in their elongate direction is maintained parallel;
   means for mounting each cross piece to the processor at a point equidistant from the pivotal mounts between said cross piece and said spreading members for pivotal motion about an axis centered along said predetermined line, the pivotal axes of the mounts between said cross pieces and said spreading memers being located along a line separated from said predetermined line by a distance at least equivalent to the separation between said predetermined line and said medial line; and
   means for oscillating said spreading members about said pivotal axes for uniformly spreading the developer over the exposed surface of the lithographic plate.

5. The developer apparatus of claim 4 wherein each of said spreading members includes a sponge for spreading the developer over the exposed surface of the lithographic plate.

6. An improved developer apparatus for use in a lithographic plate processor of the type having a pair of rectangularly shaped developer spreading members positioned on opposite sides of a predetermined line extending generally transverse to the direction of motion of a lithographic plate traveling through the processor, each spreading member further positioned for engagement with the exposed surface of the lithographic plate, a linkage mounted for pivotal motion about axes positioned on said predetermined line and maintaining said spreading members so that the medial axis extending along the elongate dimension of said spreading members and said predetermined line are maintained in a parallel relationship and means to oscillate said spreading members over the exposed surface of the lithographic plate, the improvement comprising:

mounting said linkage to each of said spreading members for pivotal motion about axes positioned on a line parallel said predetermined line and separated a distance at least equivalent to the separation between the medial axis of said spreading member and said predetermined line so that the oscillation of said spreading members uniformly spreads developer over the exposed surface of the lithographic plate, the length of each spreading member in the transverse direction being slightly less than the width of the lithographic plate in the transverse direction; and said oscillation means moving said spreading members in both directions about a central position where the spreading members are most distant from said predetermined line so that a portion of each spreading member extends over the edge of the lithographic plate at the limits of oscillation.

7. An apparatus for use in a lithographic plate processor for agitating a chemical comprising:

a tank for containing a quantity of the chemical pivotally mounted on the processor, said tank defining a first surface and a second surface extending at an angle therefrom having apertures therethrough for discharge of the chemical from the tank;

means to oscillate said tank about its pivotal axis; and means for moving along said first surface within said tank as said tank is oscillated to agitate the chemical, a portion of said moving means being separated from the first surface to permit flow of the chemical therebetween to enhance the agitation.

8. The apparatus of claim 7 wherein said moving means comprises:

an agitating bar having uniform diameter; and bands positioned at each end of said agitating bar and having a predetermined thickness for raising the agitating bar off said first surface the predetermined distance for rolling along said first surface.

9. An improved apparatus for use in a lithographic plate processor for agitating a chemical of the type having a tank for storing the chemical mounted for oscillation on the processor, said tank having a first interior surface and a second interior surface extending at an angle therefrom having apertures therethrough for discharge of the chemical from the tank and further having an agitating bar within said tank for rolling along the first interior surface as the tank is oscillated to agitate the chemical, the improvement comprising:

means for raising a portion of the agitating bar a predetermined distance off the first interior surface in the tank to permit the chemical to flow between the agitating bar and the first interior surface to enhance the agitation of the chemical as the tank oscillates and the agitating bar moves toward and away from the second interior surface.

10. The improved apparatus of claim 9 wherein said raising means comprises bands positioned about each end of the agitating bar and having a predetermined thickness.

11. An apparatus for use in a lithographic plate processor for distributing a chemical on a lithographic plate comprising:

a tank for containing the chemical pivotally mounted on the processor, a first wall of said tank having apertures formed therein;

means to oscillate said tank between first and second limits about its pivotal axis, the chemical being discharged from the tank through the apertures onto the lithographic plate when the tank is away from said first limit;

means positioned within said tank for movement toward said first wall as said tank is oscillated toward said second limit; and the internal cross sectional area of said tank parallel said first wall generally decreasing toward said first wall so that the chemical is urged through said apertures by the motion of said moving means.

12. The apparatus of claim 11 wherein said tank comprises a bottom portion defining a generally planar interior surface and walls extending upwardly therefrom to a top portion, one of said upwardly extending walls forming said first wall, said moving means comprising an agitating bar rolling on said planar interior surface of said bottom portion as said tank is oscillated, said agitating bar further acting to agitate the chemical within the tank.

13. The apparatus of claim 11 wherein a lithographic plate travels through the processor and said apparatus further comprises means for stopping the oscillation of said tank at said first limit to prevent further discharge of chemical therefrom after passage of the lithographic plate.

14. An improved apparatus for use in a lithographic plate processor for distributing a chemical over the exposed surface of a lithographic plate of the type having a tank defining an enclosure for storing the chemical pivotally mounted on the processor, said tank defining a first interior surface having at least one aperture therethrough for permitting discharge of chemicals stored in the tank onto the plate when the motion of the tank causes the level of chemical therein to rise above the lowest portion of the aperture, means to oscillate said tank about the pivotal axis and an agitating bar within said tank for movement along a second interior surface defined by said tank as the tank is oscillated to agitate the chemical, the improvement comprising:

said tank being constructed with the interior cross sectional area parallel to said first interior surface generally decreasing toward said first interior surface so that, as said agitating bar moves toward said first interior surface along said second interior surface, the pressure of the chemical between said agitating bar and said apertures is increased to enhance discharge of the chemical onto the plate.

15. The improved apparartus of claim 14 wherein the improvement further comprises a tank formed from a bottom portion defining said second interior surface and walls extending upwardly therefrom to a top portion, one of said walls defining said first interior surface thereon and said top portion being sloped downwardly toward said first interior surface.

16. The improved apparatus of claim 14 further comprising means to stop the pivotal motion of said tank in a position so that the level of the chemical within said tank is positioned below said aperture.

17. An apparatus for agitating and distributing a chemical onto the surface of a lithographic plate traveling through a lithographic plate processor comprising:
- a tank for storing the chemical defining an enclosure having a bottom portion defining a relatively planar first interior surface, a front wall extending therefrom and a top portion sloped toward said bottom portion at said front wall, said front wall defining a second interior surface and having a plurality of apertures formed therethrough at a predetermined distance from said first interior surface;
- means supporting said tank for pivotal motion about an axis generally transverse to the direction of travel of the lithographic plate so that the apertures lie above the lithographic plate and extend substantially across the entire width of the plate in the transverse direction;
- an agitating bar within said tank extending substantially the entire width of the interior of said tank for rolling on said first interior surface as said tank is pivoted, each end of said agitating bar having a band of predtermined thickness secured thereto so that a portion of the agitating bar is separated from said first interior surface;
- means for oscillating said tank about the axis from a first limit to a second limit wherein said agitating bar rolls toward said second interior surface;
- the oscillation of said tank causing said agitating bar to move along said first interior surface, the chemical flowing between said first interior surface and said agitating bar for agitating the chemical, the motion of said agitating bar toward said second interior surface further acting to urge the chemical through the apertures to distribute the chemical on the surface of the lithographic plate; and
- means for controlling flow of the chemical through said apertures.

18. The apparatus of claim 17 wherein said controlling means comprises petcocks secured at each aperture to control the flow of the chemical.

* * * * *